(12) United States Patent
Su

(10) Patent No.: US 7,675,749 B2
(45) Date of Patent: Mar. 9, 2010

(54) HEAT DISSIPATING STRUCTURE OF 1U POWER SUPPLY

(75) Inventor: Chun-Lung Su, Taipei Hsien (TW)

(73) Assignee: Zippy Technology Corp., Taipei Hsien (TW)

( * ) Notice: Subject to any disclaimer, the term of this patent is extended or adjusted under 35 U.S.C. 154(b) by 57 days.

(21) Appl. No.: 11/954,937

(22) Filed: Dec. 12, 2007

(65) Prior Publication Data

US 2009/0154090 A1 Jun. 18, 2009

(51) Int. Cl.
*H05K 7/20* (2006.01)
(52) U.S. Cl. .................................... 361/695; 361/715
(58) Field of Classification Search ................. 361/688, 361/690, 694–695, 715, 716; 165/80.3, 121, 165/122; 454/184
See application file for complete search history.

(56) References Cited

U.S. PATENT DOCUMENTS

| | | | |
|---|---|---|---|
| 5,260,851 A | | 11/1993 | Chiou et al. |
| 5,831,847 A | * | 11/1998 | Love ........................... 363/141 |
| 6,246,580 B1 | * | 6/2001 | Weng .......................... 361/695 |
| 6,520,851 B1 | | 2/2003 | Shih et al. |
| 6,778,381 B1 | * | 8/2004 | Bolognia et al. ........ 361/679.07 |
| 7,495,911 B2 | * | 2/2009 | Chen et al. ................... 361/695 |
| 2006/0012953 A1 | * | 1/2006 | Mills et al. .................. 361/690 |

FOREIGN PATENT DOCUMENTS

| | | |
|---|---|---|
| TW | M255639 U | 1/2005 |
| TW | M306684 U | 2/2007 |

* cited by examiner

*Primary Examiner*—Boris L Chervinsky
(74) *Attorney, Agent, or Firm*—Muncy, Geissler, Olds & Lowe, PLLC

(57) ABSTRACT

A heat dissipating structure of a 1U power supply is installed in an industrial computer host system of a universal standard specification 1U for supplying electric power, and at least one wall of the power supply differentiates a retaining plane and a heat dissipating plane having a heat dissipating hole with a height difference, and a horizontal plane of the heat dissipating plane is lower than the retaining plane and forms an airflow passage with the computer host system for guiding a heat dissipated airflow through the airflow passage to improve the poor heat dissipation at both distal ends of the traditional 1U power supply due to the same height of the power supply and the computer host system or the proximity of both sides of the power supply with an installed electronic device such as a hard disk.

7 Claims, 5 Drawing Sheets

HEAT DISSIPATING STRUCTURE OF 1U POWER SUPPLY

FIELD OF THE INVENTION

The present invention relates to a heat dissipating structure of a 1U power supply, and more particularly to a heat dissipating structure applied in an industrial computer host system of a universal standard specification 1U for supplying electric power.

BACKGROUND OF THE INVENTION

As the power of computer host systems increases, the required converted power of a power supply for supplying electric power increases accordingly, and the technical issues of increasing the converted power reside on a heat dissipating structure. Particularly, a 1U power supply is limited by the height as specified by the universal standard 1U specification and installed to a fan having a height less than 40 mm, and thus the wind or airflow provided by the fan is very limited. Obviously, the design of heat dissipating holes at an air outlet or an air inlet for guiding heat dissipated airflow becomes a key point of the design. In FIG. 1, present designs generally build heat dissipating holes on a rear panel of the power supply, but such arrangement cannot meet the requirements of a power supply with a large power. Some designs also build heat dissipating holes on the four walls at the rear of a power supply, but the heights of the power supply and the computer host system is equal, such that when the power supply is installed in the computer host system, the heat dissipating holes on the upper wall and the lower wall are blocked by the upper casing and chassis of the computer host system, and the heat dissipated airflow cannot be guided, and the heat dissipating holes on the two walls are blocked by side panels of the computer host system or an installed electronic device such as a hard disk, and the heat dissipated airflow cannot be guided either.

In R.O.C. Pat. No. M255,639, the patent did not disclose whether or not the patented invention can be applied to the 1U power supply, but such invention must sacrifice a portion of the space inside the power supply to install a blower fan for a larger wind flow. In addition to an increased length of the power supply, the heat dissipating holes on the front panel cannot manage to guide and discharge the airflow, but the heat dissipated airflow will flow back at an electric power panel. To improve the backflow problem, both U.S. Pat. No. 6,520,851 and R.O.C. Pat. No. M306,684 disclosed related backflow prevention designs, but these patented technologies still cannot overcome the height issue of the 1U specification, and thus are not applicable for the 1U power supply.

U.S. Pat. No. 5,260,851 disclosed a power supply that is installed in a hard disk. Although an upper wall of the power supply constitutes a hard disk containing space by a height difference, the height difference cannot form an airflow passage effectively, and such patented invention cannot be applied in the 1U power supply.

SUMMARY OF THE INVENTION

In view of the foregoing shortcoming of the prior art, the present invention has a primary objective of overcoming the foregoing shortcomings and avoiding the deficiency by designing an airflow passage to guide a heat dissipated airflow effectively under the height limitation of the 1U power supply and improve the poor heat dissipation at both distal ends of the traditional 1U power supply due to the same height of the power supply and the computer host system or the proximity of both sides of the power supply with an electronic device such as a hard disk.

To achieve the foregoing objective, the invention includes at least one wall of the power supply that differentiates a retaining plane and a heat dissipating plane having heat dissipating holes with different heights, and a horizontal plane of the heat dissipating plane is lower than the retaining plane and forms an airflow passage with the computer host system, so that the heat dissipated airflow can be guided through the airflow passage effectively.

DETAILED DESCRIPTION OF THE PREFERRED EMBODIMENTS

The technical contents of the invention will now be described in more detail hereinafter with reference to the accompanying drawings that show various embodiments of the invention.

Figure 1:
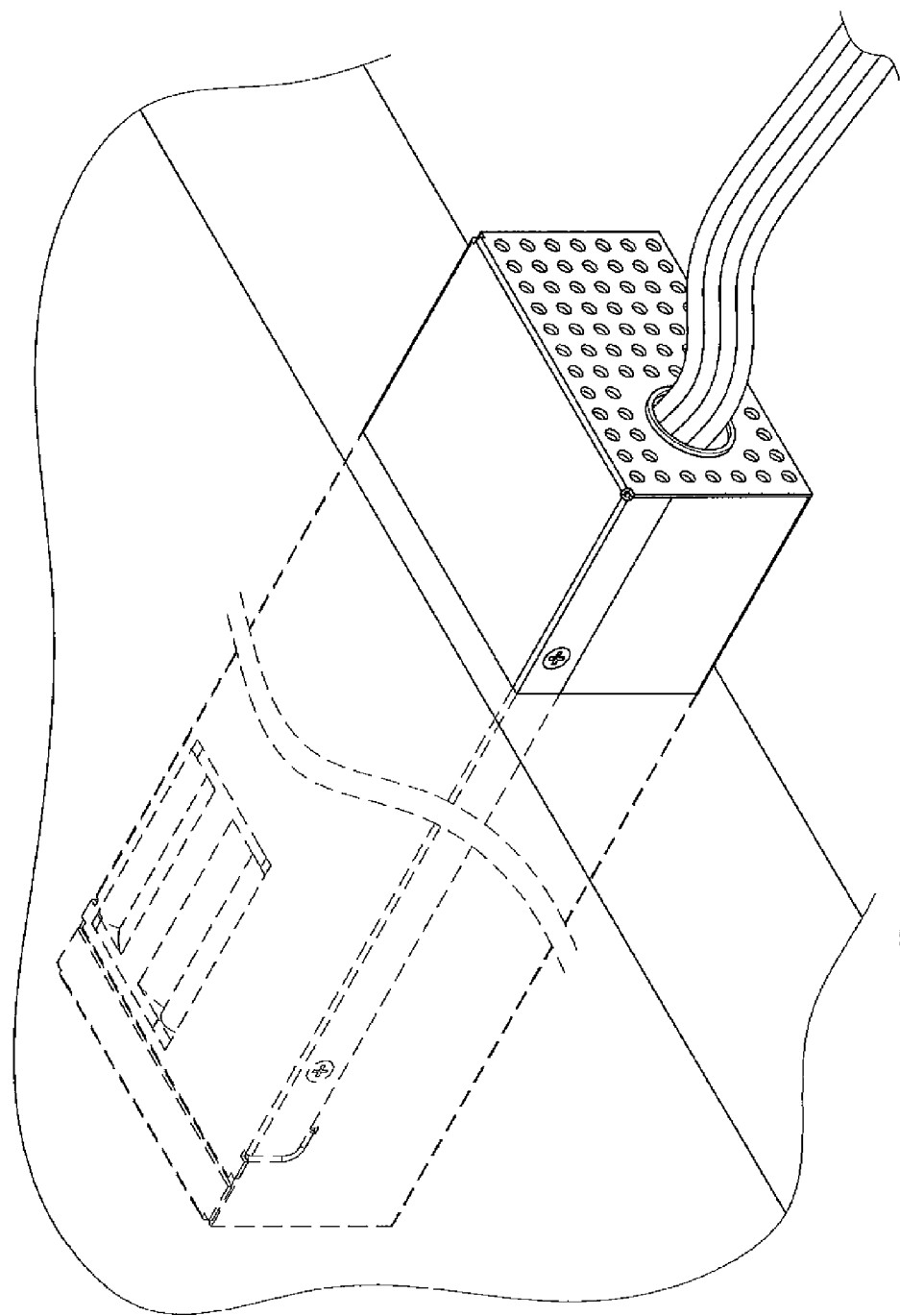
FIG. 1 is a schematic view of a power supply and a computer host system of a prior art.
Figure 2:
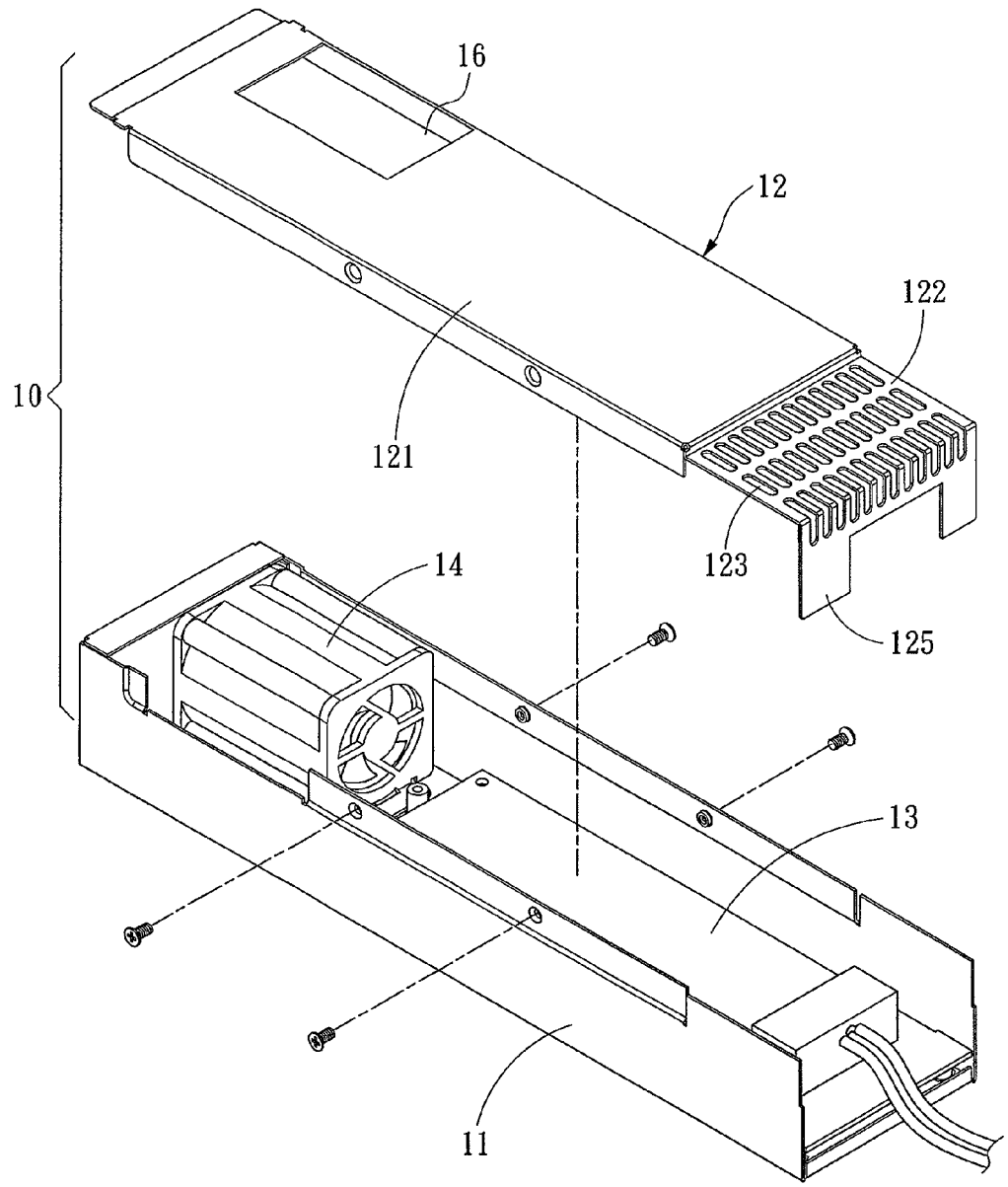
FIG. 2 is an exploded view of a structure of a power supply in accordance with the present invention.
Figure 3:
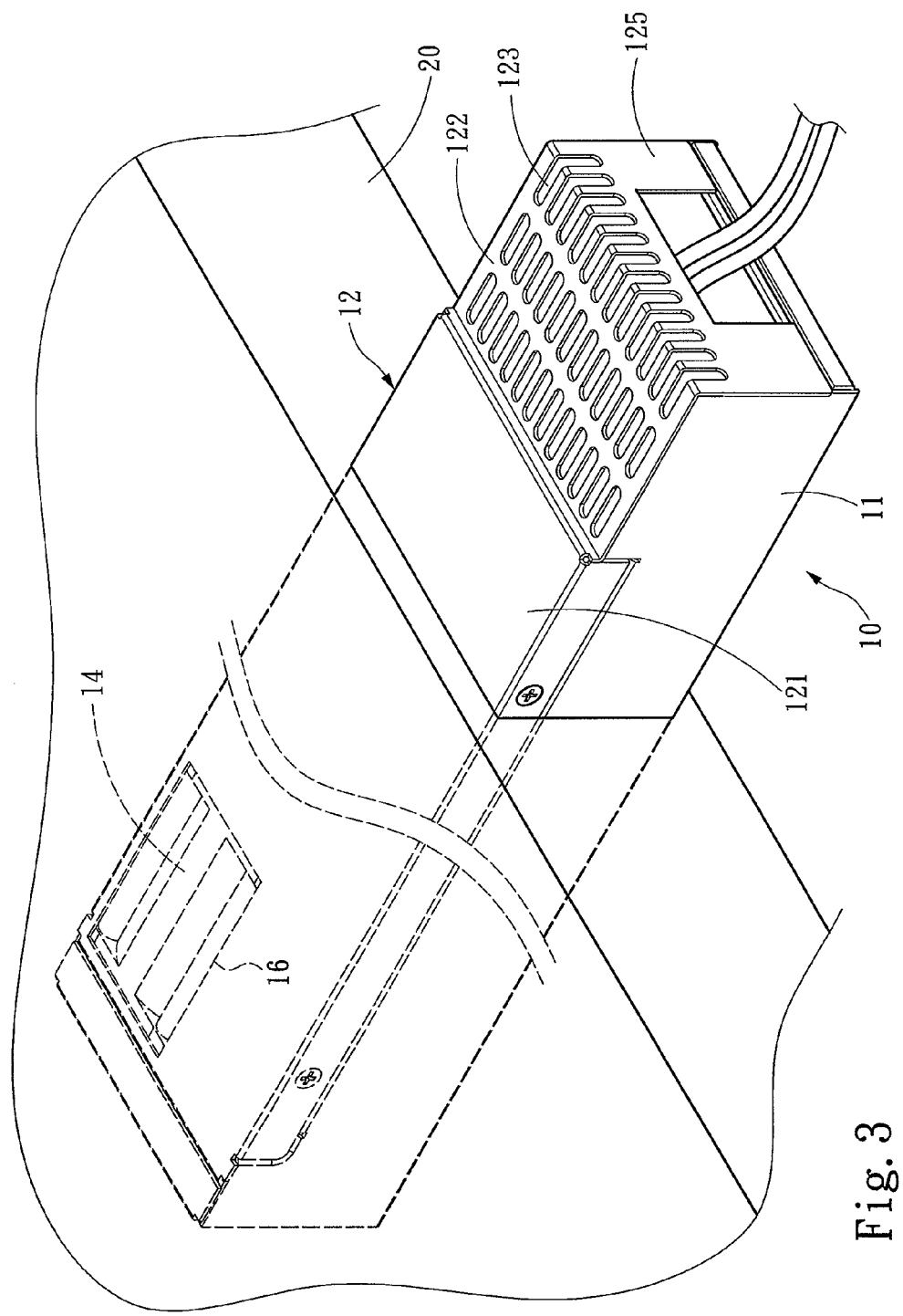
FIG. 3 is a schematic view of assembling a power supply and a computer host system in accordance with the present invention.

Referring to FIGS. 2 and 3 for a heat dissipating structure of a 1U power supply 10 in accordance with the present invention, the power supply 10 is installed in an industrial computer host system 20 of a universal standard specification 1U for supplying electric power, and the power supply 10 includes two end panels 125 and four walls 11, 12 of detachable upper casing and chassis which are enclosed to form a hollow space for installing an electric power panel 13, and the panel 125 includes an electric port (not shown in the figure) coupled to an external power supply and a wire portion of the electric power panel 13, wherein the present invention is characterized in that at least one wall 11, 12 of the power supply 10 differentiates a retaining plane 121 and a heat dissipating plane 122 having a heat dissipating hole 123 with a height difference, and the interior of the power supply 10 includes at least one fan 14 installed at a section of the retaining plane 121, and the horizontal plane of the heat dissipating plane 122 is lower than the retaining plane 121 and forms an airflow passage 15 with the computer host system 20 to guide a heat dissipated airflow of the fan 14 effectively. The retaining plane 121 is joined to the heat dissipating plane 122 by an engaging plane 126.

Figure 4:
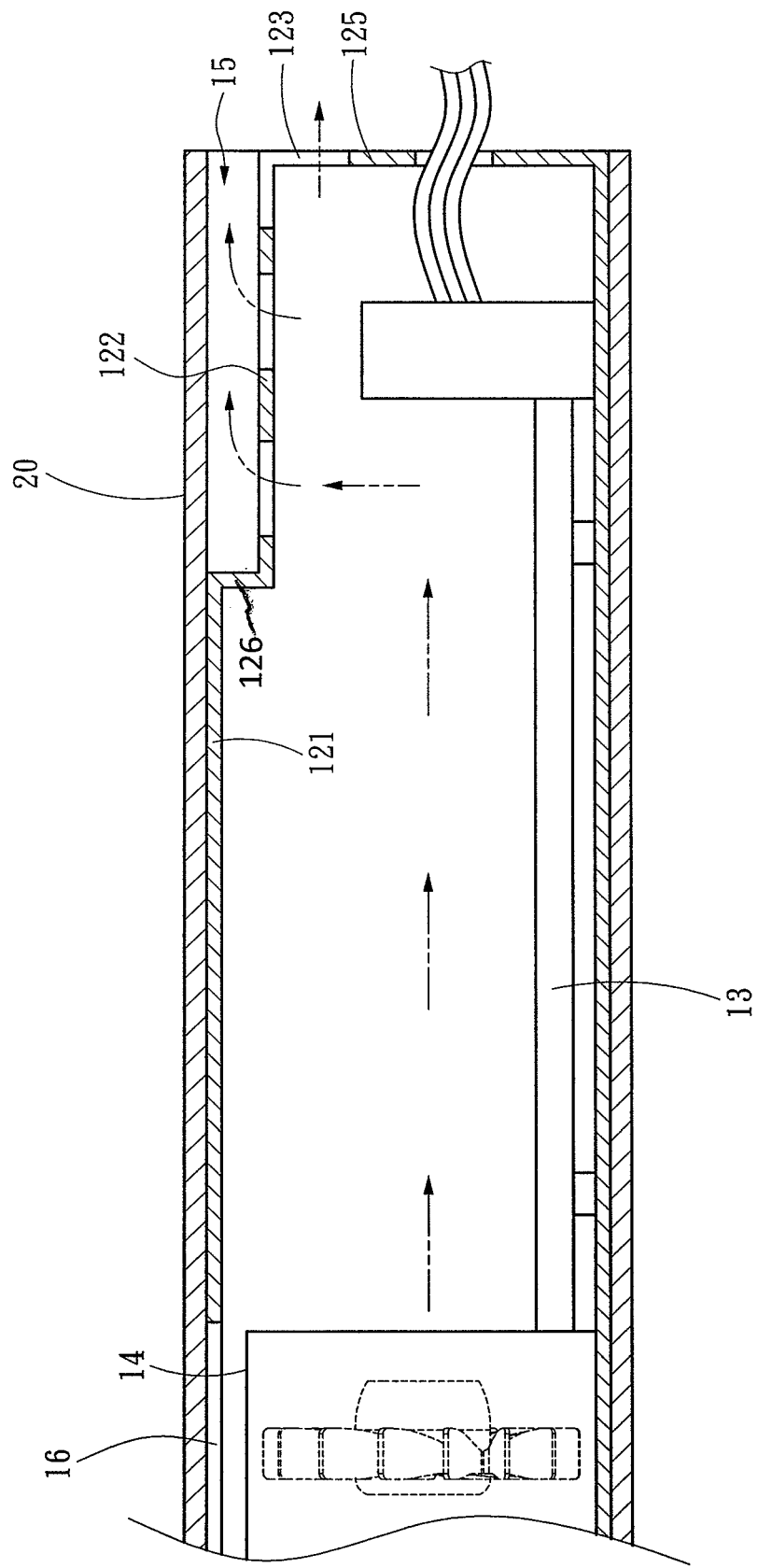
FIG. 4 is a schematic view of guiding heat dissipated airflow in accordance with the present invention.
Figure 5:
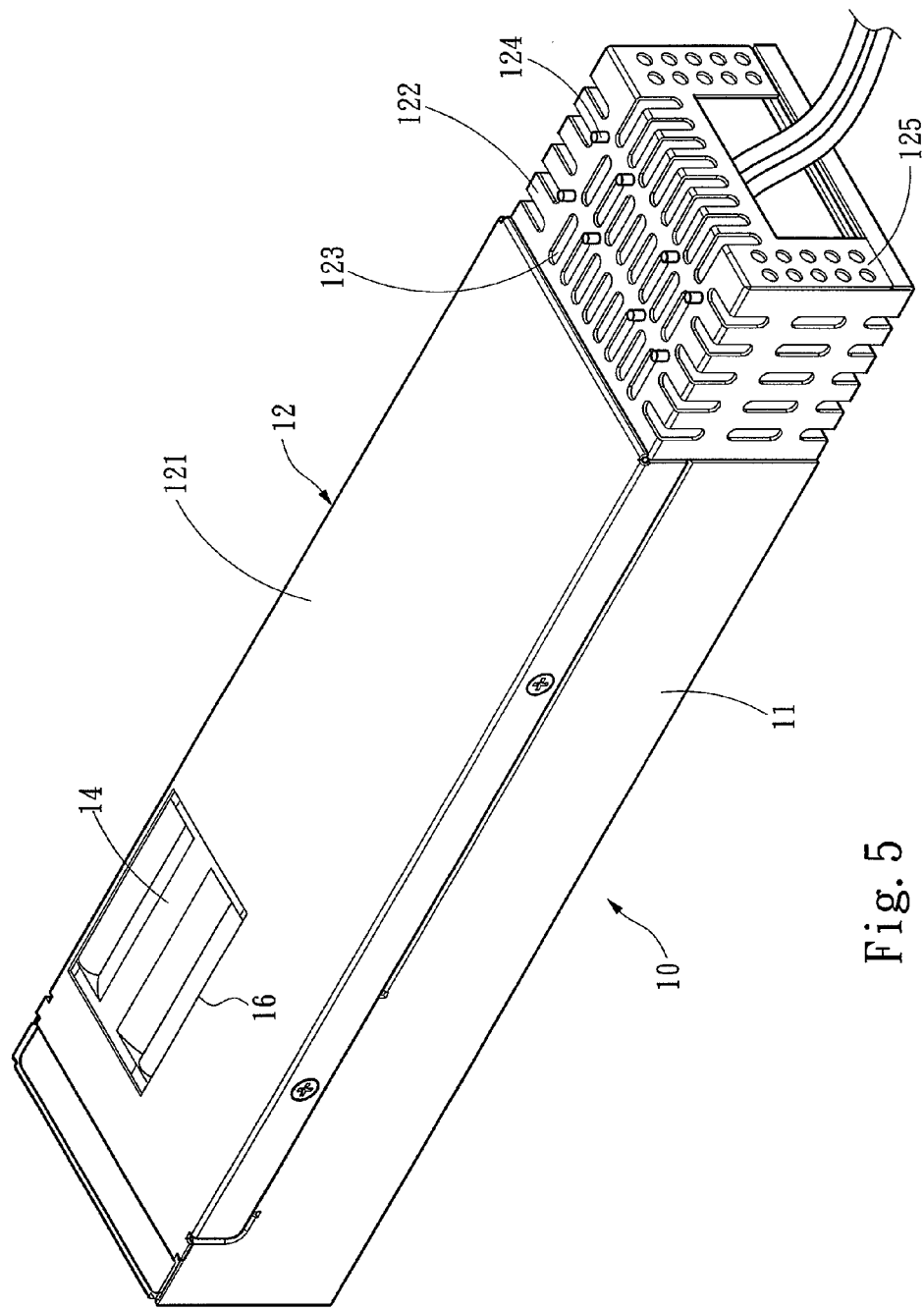
FIG. 5 is a schematic view of another preferred embodiment of the present invention.

In a preferred embodiment as shown in FIG. 4, the fan 14 installed in a 1U power supply 10 of a universal standard specification has the same height with the power supply 10, and the power supply 10 includes a containing hole 16 for installing the fan 14, and the height difference is preferably disposed at the upper wall 12 of the power supply 10, and the heat dissipating hole 123 on the heat dissipating plane 122 is extended to the panel 125 of the power supply 10, or designed on the two walls 11 or bottom wall as shown in FIG. 5, and the heat dissipating holes 123 of adjacent walls 11, 12 are preferably a continuous curved hole. To prevent insufficient strength of the power supply 10 caused by the height difference between the retaining plane 121 of the computer host system 20 and the heat dissipating plane 122, a reinforced element 124 having the same height of the retaining plane 121 is protruded from the heat dissipating plane 122 and contacted with the computer host system 20 as shown in FIG. 5, and the heat dissipating plane 122 is formed by coupling a separating element and the power supply 10.

Referring to FIG. 4 for a schematic view of guiding a heat dissipated airflow in accordance with the present invention, the airflow passage 15 is formed by a height difference between the heat dissipating plane 122 and the computer host system 20, such that when the fan 14 of the power supply 10 is operated to drive an airflow for dissipating heat produced by the electric power panel 13, the heat of the airflow is dissipated from the heat dissipating hole 123 of the rear panel 125 to the outside and from the heat dissipating hole 123 of upper wall 12 to the outside through the airflow passage 15. By guiding the airflow through the airflow passage 15, the present invention can improve the poor heat dissipation at both distal ends of the traditional 1U power supply due to the same height of the 1U power supply 10 and the computer host system 20 or the proximity of both sides of the power supply with an installed electronic device such as a hard disk.

While the invention has been described by means of specific embodiments, numerous modifications and variations could be made thereto by those skilled in the art without departing from the scope and spirit of the invention set forth in the claims.

What is claimed is:

1. A heat dissipating structure of a power supply, installed in an industrial computer host system for supplying electric power, comprising:
   at least one wall of the power supply;
   a retaining plane included in said wall;
   a heat dissipating plane included in said wall having a heat dissipating hole,
   an engaging plane connected to the retaining plane and the heat dissipating plane with a first angle and a second angle, respectively, to form a height difference between the retaining plane and the heat dissipating plane;
   the interior of the power supply being disposed at a section of the retaining plane including at least one fan, and
   a horizontal plane of the heat dissipating plane being lower than the retaining plane and forming an airflow passage for guiding the heat dissipated airflow of the fan.

2. The heat dissipating structure of the power supply as recited in claim 1, wherein the fan and the power supply are of the same height, and the power supply includes a containing hole for installing the fan.

3. The heat dissipating structure of the power supply as recited in claim 1, wherein the heat dissipating hole disposed on the heat dissipating plane is extended to the power supply panel.

4. The heat dissipating structure of the power supply as recited in claim 1, wherein the heat dissipating plane includes a reinforced element protruded thereon and having a height equal to the retaining plane.

5. The heat dissipating structure of the power supply as recited in claim 1, wherein the heat dissipating plane is assembled separately with the power supply.

6. The heat dissipating structure of the power supply as recited in claim 1, wherein the height difference is disposed at an upper wall of the power supply.

7. The heat dissipating structure of the power supply as recited in claim 1, wherein the height difference is disposed at the two walls or a bottom wall, and the heat dissipating holes of adjacent walls are a continuous curved hole.

* * * * *